(12) United States Patent
Nazarian et al.

(10) Patent No.: US 8,681,558 B2
(45) Date of Patent: Mar. 25, 2014

(54) PARALLEL BITLINE NONVOLATILE MEMORY EMPLOYING CHANNEL-BASED PROCESSING TECHNOLOGY

(75) Inventors: Hagop Nazarian, San Jose, CA (US); Richard Fastow, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 527 days.

(21) Appl. No.: 12/575,137

(22) Filed: Oct. 7, 2009

(65) Prior Publication Data

US 2011/0080792 A1 Apr. 7, 2011

(51) Int. Cl.
*G11C 11/34* (2006.01)
*G11C 16/04* (2006.01)

(52) U.S. Cl.
USPC ..................... 365/185.18; 365/195

(58) Field of Classification Search
USPC .................. 365/185.33, 185.18, 195, 185.01, 365/185.23, 189.11, 226, 238.5, 185.05, 365/185.29, 185.11
See application file for complete search history.

(56) References Cited

U.S. PATENT DOCUMENTS

| | | | | |
|---|---|---|---|---|
| 6,144,584 A * | 11/2000 | Kunori et al. | ............ | 365/185.18 |
| 6,307,807 B1 * | 10/2001 | Sakui et al. | ................ | 365/238.5 |
| 7,200,027 B2 * | 4/2007 | Seshadri et al. | ............. | 365/145 |
| 7,349,271 B2 * | 3/2008 | Kuang et al. | .................. | 365/201 |
| 7,515,478 B2 * | 4/2009 | Li et al. | ..................... | 365/185.26 |
| 7,535,767 B2 | 5/2009 | Nazarian | | |
| 7,639,540 B2 * | 12/2009 | Kim et al. | ................ | 365/185.18 |
| 7,746,698 B2 * | 6/2010 | Liu et al. | .................. | 365/185.18 |
| 2007/0039195 A1 * | 2/2007 | Leslie et al. | .................... | 33/414 |
| 2008/0225607 A1 | 9/2008 | Achter | | |
| 2009/0003074 A1 * | 1/2009 | Georgescu et al. | ...... | 365/185.18 |
| 2009/0135659 A1 | 5/2009 | Jones | | |
| 2009/0161466 A1 | 6/2009 | Hamilton | | |
| 2010/0265766 A1 * | 10/2010 | Lue | .......................... | 365/185.03 |

OTHER PUBLICATIONS

U.S. Appl. No. 12/267,017, filed Nov. 7, 2008, entitled "Error Correction for Flash Memory", 48 pages.

* cited by examiner

*Primary Examiner* — Harry W Byrne
*Assistant Examiner* — Lance Reidlinger
(74) *Attorney, Agent, or Firm* — Amin, Turocy & Watson, LLP

(57) ABSTRACT

Providing for a new combination of non-volatile memory architecture and memory processing technology is described herein. By way of example, disclosed is a parallel bitline semiconductor architecture coupled with a channel-based processing technology. The channel based processing technology provides fast program/erase times, relatively high density and good scalability. Furthermore, the parallel bitline architecture enables very fast read times comparable with drain-based tunneling processes, achieving a combination of fast program, erase and read times far better than conventional non-volatile memories.

18 Claims, 11 Drawing Sheets

PARALLEL BITLINE CELL ARCHITECTURE

PARALLEL BITLINE NONVOLATILE MEMORY EMPLOYING CHANNEL-BASED PROCESSING TECHNOLOGY

BACKGROUND

Memory devices have a wide range of uses in modern electronics and electronic devices. In general, various types of electronic memory exist, including hard disc memory, floppy disc memory, magnetic tape memory, optical disk memory, and so on. One of the more innovative and diversified types of memory is semiconductor memory.

One type of semiconductor memory commonly used for modern electronics is nonvolatile Flash memory. Flash memory comprises arrays of semiconductor devices that can be utilized to store, erase and re-store digital information. Compared to other types of electronic memory, Flash memory is fast both in terms of programming and erasing, as well as reading data, has good data retention characteristics, and is highly cost effective. Accordingly, Flash memory is utilized for data storage in an ever-increasing number of electronic devices and applications, including computers, cell phones, smart-phones, digital cameras and camcorders, game stations, and so forth.

One great advantage of Flash memory is that stored data can be retained without continuous electrical power applied to a Flash memory module. In addition, Flash memory is a solid-state technology that can be very dense—in terms of memory cells per unit volume—typically requiring no moving parts for basic operation. Accordingly, Flash memory is ideal as removable and portable data storage for consumer electronics, and is utilized with universal interface technologies for a wide array of electronic devices, such as universal serial bus (USB) technology.

Like most consumer electronic technologies, advancements in nonvolatile memory are driven by a desire for faster, more dense (in terms of data storage per volume) and more cost-effective electronic devices. One major limiting factor for speed and sophistication of electronic devices and complexity of device software is the physical capabilities of digital memory employed by those devices. Invariably, smaller, faster computers require faster and denser memory. Research and development in nonvolatile memory is therefore generally focused on achieving these goals. In recent years, this research and development has achieved many advancements in nonvolatile solid-state memory, providing faster program, erase or read times, reduced power consumption, greater memory density, increased storage reliability, reduced error rate, and the like. However, these advancements are not all achieved in unison, and can be particular to different types of solid-state memory. For instance, in regard to Flash memory, NAND-type semiconductor memory has among the best program and erase speeds, and is highly scalable with higher cell densities, but has a relatively slow read times and long-term storage reliability. On the other hand, a NOR-type semiconductor provides much greater read speed than the NAND-type semiconductor, and has better long-term storage reliability. These memory technologies (and other nonvolatile memory) have different semiconductor structures, however, so achieving the benefits of both semiconductor types is not a simple task. Ongoing research in non-volatile memory is directed at improving upon these memory technologies, however.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

To improve upon existing digital memory, the subject disclosure provides non-volatile memory comprising a parallel bitline semiconductor architecture coupled with a channel-based operating process. The parallel bitline semiconductor architecture provides a dense semiconductor structure that is highly scalable. In addition, the parallel bitline architecture enables single-cell access for program and read operations, providing high read performance and high program/erase performance in a single non-volatile memory device. This provides a significant advantage over existing technologies, leading to faster, more reliable memory with reduced power consumption and increased scalability.

In other aspects of the subject disclosure, a semiconductor operating process employing electron or hole tunneling over a channel region of a semiconductor transistor is provided for parallel bitline nonvolatile memory. The operating process comprises setting a wordline associated with a program cell to a high program voltage, while grounding bitlines of the program cell. This results in electron tunneling across a channel region of the program cell, increasing the threshold voltage of such cell. Bitlines of other memory cells sharing the wordline can be disconnected from ground and voltage sources, inhibiting programming of these other memory cells. To improve this program inhibiting, one or more other wordlines adjacent to the associated wordline can be raised to an intermediate voltage, thereby boosting voltage of inhibited bitlines through capacitive coupling. This operating process provides fast and highly scalable cell programming with minimal power consumption and reduced program errors.

In other aspects of the subject disclosure, a read process is provided for the parallel bitline nonvolatile memory. The read process comprises identifying a memory cell to be read, and selecting a wordline of that memory cell. The wordline is set to a wordline read voltage, and a local data line of the memory cell is set to a data line read voltage. In addition, at least one wordline adjacent to the selected wordline is set to a negative voltage. The read process provides for single-cell read access, as well as greatly improved read performance for parallel bitline memory employing a channel-based operating process, as compared with conventional non-volatile memory employing a channel tunneling process. In addition, the read process results in reduced power consumption for such non-volatile memory.

The following description and the annexed drawings set forth in detail certain illustrative aspects of the disclosed subject matter. These aspects are indicative, however, of but a few of the various ways in which the principles of the innovation can be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
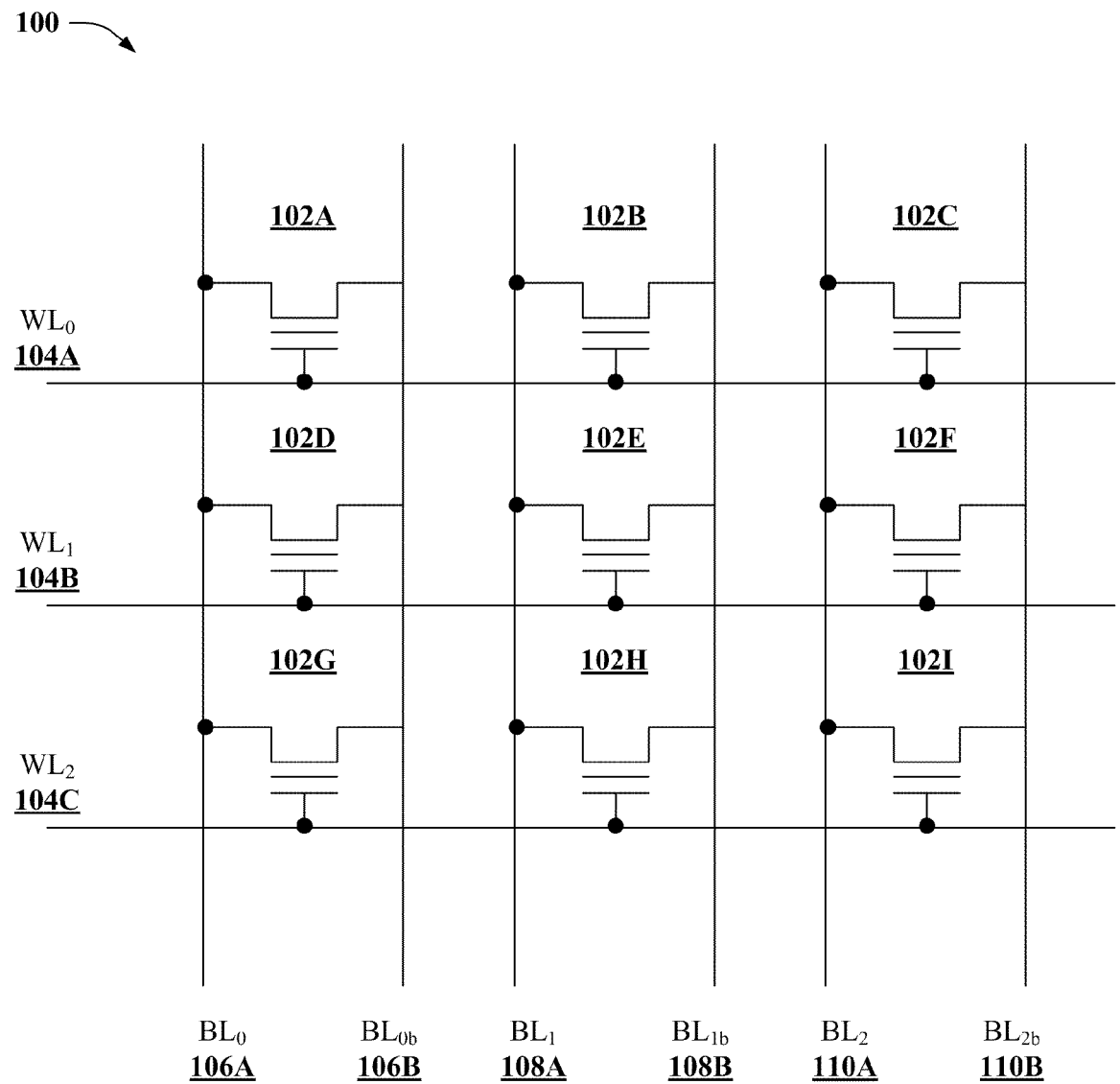
FIG. 1 illustrates a diagram of an example parallel bitline semiconductor architecture for non-volatile memory according to aspects of the subject disclosure.

The disclosed subject matter is described with reference to the drawings, wherein like reference numerals are used to refer to like elements throughout the description. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram or schematic form in order to facilitate describing the subject innovation.

As utilized herein, terms "component," "system," "architecture" and the like are intended to refer to a computer or electronic-related entity, either hardware, a combination of hardware and software, software (e.g., in execution), or firmware. For example, a component can be one or more semiconductor storage cells, a processor, a process running on the processor, an object, an executable, a program, or a computer. The component can include erasable programming (e.g., process instructions at least in part stored in erasable memory) or hard programming (e.g., process instructions burned into non-erasable memory at manufacture). By way of illustration, both a process executed from memory and the processor can be a component. One or more components can reside within a process or thread of execution and a component can be localized on one processing device (e.g., onboard processing) or distributed between two or more processing devices (e.g., involving onboard and host computer processing). As another example, an architecture can include an arrangement of electronic hardware (e.g., parallel or serial semiconductors), processing instructions and a processor, which implement the processing instructions in a manner suitable to the arrangement of electronic hardware.

Furthermore, the claimed subject matter can be implemented as a method, apparatus, or article of manufacture using typical manufacturing, programming or engineering techniques to produce hardware, firmware, software, or any combination thereof to control an electronic device to implement the disclosed subject matter. The term "article of manufacture" as used herein is intended to encompass an electronic device, a computer, or a computer program accessible from any computer-readable device, carrier, or media. Computer-readable media can include hardware media, or software media. In addition, the media can include storage media, or transport media. For example, computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, wave interface modules (e.g., a wireless communication interface), or the like. Of course, those skilled in the art will recognize many modifications can be made to this configuration without departing from the scope or spirit of the claimed subject matter.

The disclosed subject matter relates to improved performance for non-volatile memory. More specifically, provided is a new combination of non-volatile memory architecture and memory processing technology that yields significant benefits over conventional non-volatile memory. As an example, aspects of the subject disclosure provide memory that achieves optimal program/erase times, as well as optimal read times. Typically, optimizing program/erase times requires a memory architecture or processing technology with inherently slower read times, or vice versa. The subject disclosure provides a significant improvement to this problem. In addition, the provided memory exhibits optimal scalability, enabling improved memory cell density in conjunction with smaller transistor technology. In addition, the memory exhibits strong data retention and reliability, optimal power consumption, multi-level cell capability, among other improvements in non-volatile memory technology, discussed herein.

Referring to the drawings, FIG. 1 illustrates a schematic diagram of an example memory cell architecture 100 according to aspects of the subject disclosure. The memory cell architecture 100 comprises a parallel bitline arrangement of a two-dimensional array of semiconductor transistors (102). The parallel bitline arrangement refers to an electrical transistor-bitline arrangement, in which groups of transistors (102) associated with a pair of bitlines are connected to the pair of bitlines in parallel (from an electrical coupling standpoint). Said differently, each transistor of the group is electrically coupled to both bitlines of the pair of bitlines (e.g., where one bitline of the pair is connected to a source region of one of the transistors, and the other bitline of the pair is connected to a drain region of the one transistor). Although the bitlines are depicted as being geometrically parallel as well, this is not required, although it is permitted.

Although a single two-dimensional array (100) is depicted at FIG. 1, it is to be appreciated that additional array dimensions can be provided, such as a three-dimensional array comprising stacked two-dimensional arrays (100), or groups of such three-dimensional arrays, and so forth. The semiconductor transistors (102) can be formed utilizing various suitable semiconductor etching techniques. It is to be appreciated, however, that the subject disclosure should not be limited to one or another etching technique; rather, any suitable semiconductor etching technique (e.g., photolithography) can be employed for forming the semiconductor transistors (102).

Further to the above, it should be appreciated that cell architecture 100 can be constructed from a variety of semiconductor transistor technologies. For instance, the semiconductor transistors (102) could include non-volatile memory, such as flash memory, read only memory (ROM), programmable ROM (PROM), erasable programmable read only memory (EPROM), electronically erasable programmable read only memory (EEPROM), and the like. As an example, cell architecture 100 can comprise single-bit flash memory (e.g., having a single program state and a single erase state), multi-bit flash memory (e.g., a quad-bit cell having three distinct program voltage thresholds and an erase voltage threshold), multi-cell flash memory (e.g., a dual-cell technology comprising distinct and adjacent transistors), or the like, or a combination thereof. Furthermore, it should be appreciated that cell architecture 100 can utilize various transistor technologies, including NAND technology, AND technology, NOR technology, and so on. As one specific example, cell architecture 100 can comprise charge-trap (CT)-NOR semiconductor transistors (102A-102I).

As utilized herein, the term "memory device" or "memory storage device" refers to a non-volatile digital data storage entity that comprises at least one memory cell architecture 100, and preferably many memory cell architectures 100 arranged in suitable stacked or adjacent layers. In addition, the term "memory cell" refers to one or a small group of transistors (102) of one or more memory cell architectures 100. For instance, a cell could comprise a single transistor (102), pairs of transistors (e.g., as utilized in MirrorBit® memory), or groups of transistors (e.g., four-transistor array). In addition, the term "bit level" refers to one or more discreet values, or value ranges, of electric charge stored in a memory cell that correspond to a discreet information character. The term "bit" refers to two discreet information characters, each defined as a different "bit level". As an illustrative example, a single transistor cell having one bit, can be programmed to one of two bit levels. The bit levels correspond to different values (or value ranges) of charge stored in a channel region of the cell, generating a measurable voltage across the channel region. For this example, assume that the bit levels are defined as 0 volts to 1.5 volts=a bit level of "0", or an un-programmed bit state, and 3.5 volts to 5.0 volts=a bit level of "1", or a programmed state. A threshold voltage ($V_T$) between the value ranges (or values) can be utilized to distinguish the bit level of this example cell. For instance, if $V_T$ is selected to be 2.0 volts, a cell voltage above 2.0 volts is assumed to be a programmed bit level, and a cell voltage below 2.0 volts is assumed to be an un-programmed bit level. It is to be appreciated that this is only one example of permitted voltage ranges for bit levels. Also, a cell can have more than a single bit level. For instance, a quad-bit cell can comprise four distinct bit levels, defined as four discreet information characters (e.g., 0, 1, 2 and 3, for instance). Other examples known to one of skill in the art, or made known to one of skill in the art by way of the context provided by the subject disclosure, are considered within the scope of the description and appended claims.

The cell architecture 100 of FIG. 1 comprises a set of semiconductor transistors 102A, 102B, 102C, 102D, 102E, 102F, 102G, 102H, 102I (102A-102I collectively). Each semiconductor-transistor 102A-102I is coupled with a single wordline 104A, 104B, 104C (104A-104C collectively), either $WL_0$ 104A, $WL_1$ 104B, or $WL_2$ 104C, as well as a pair of bitlines 106A and 106B (collectively referred to as bitline pair 106), 108A and 108B (collectively referred to as bitline pair 108), and 110A and 110B (collectively referred to as bitline pair 110). Each bitline pair 106-110 includes a local source line (106A, 108A, 110A) and a local data line (106B, 108B, 110B), discussed in more detail at FIG. 2, infra. As depicted, the transistors 102A-102I are arranged in parallel subsets along their respective bitline pairs (106-110). Said differently, each transistor 102A-102I is directly connected to each respective bitline (a local source line and a local data line) of an associated bitline pair.

As utilized herein, the term "parallel bitline" or "parallel bitline architecture" refers to a plurality of transistors arranged electrically in parallel along a common pair of bitlines, as discussed above and as depicted by FIG. 1. Accordingly, transistors 102A, 102D and 102G sharing bitline pair 106 form one subset of parallel bitline transistors, while transistors 102B, 102E, 102H sharing bitline pair 108 and transistors 102C, 102F and 102I sharing bitline pair 110, respectively, form additional subsets of parallel bitline transistors. However, when based on this parallel arrangement, the two-dimensional cell architecture 100 is itself referred to herein as a "parallel bitline architecture", or "parallel bitline semiconductor architecture".

This parallel bitline arrangement (100) enables direct access to each transistor 102A-102I of the architecture 100. Specifically, the each combination of a pair of bitlines (106A-106B, 108A-108B, 110A-110B) and a wordline intersects a unique transistor cell (102A-102I). Accordingly, by selecting a single wordline 104A-104C and a single pair of bitlines (106-110), a single cell is also selected. This single-cell access enables much faster read times, when utilizing a suitable read processing technology (e.g., see FIG. 10, infra), as compared with serial bitline transistor architectures. However, when employing a suitable channel-based tunneling process (e.g., see FIG. 3, infra), cell architecture 100 can also exhibit very fast program/erase times, low power consumption, high scalability and high data retention/reliability of many serial bitline transistor technologies. This combines the optimal features of both parallel and serial bitline technologies, resulting in a truly revolutionary non-volatile memory technology.

Figure 2:
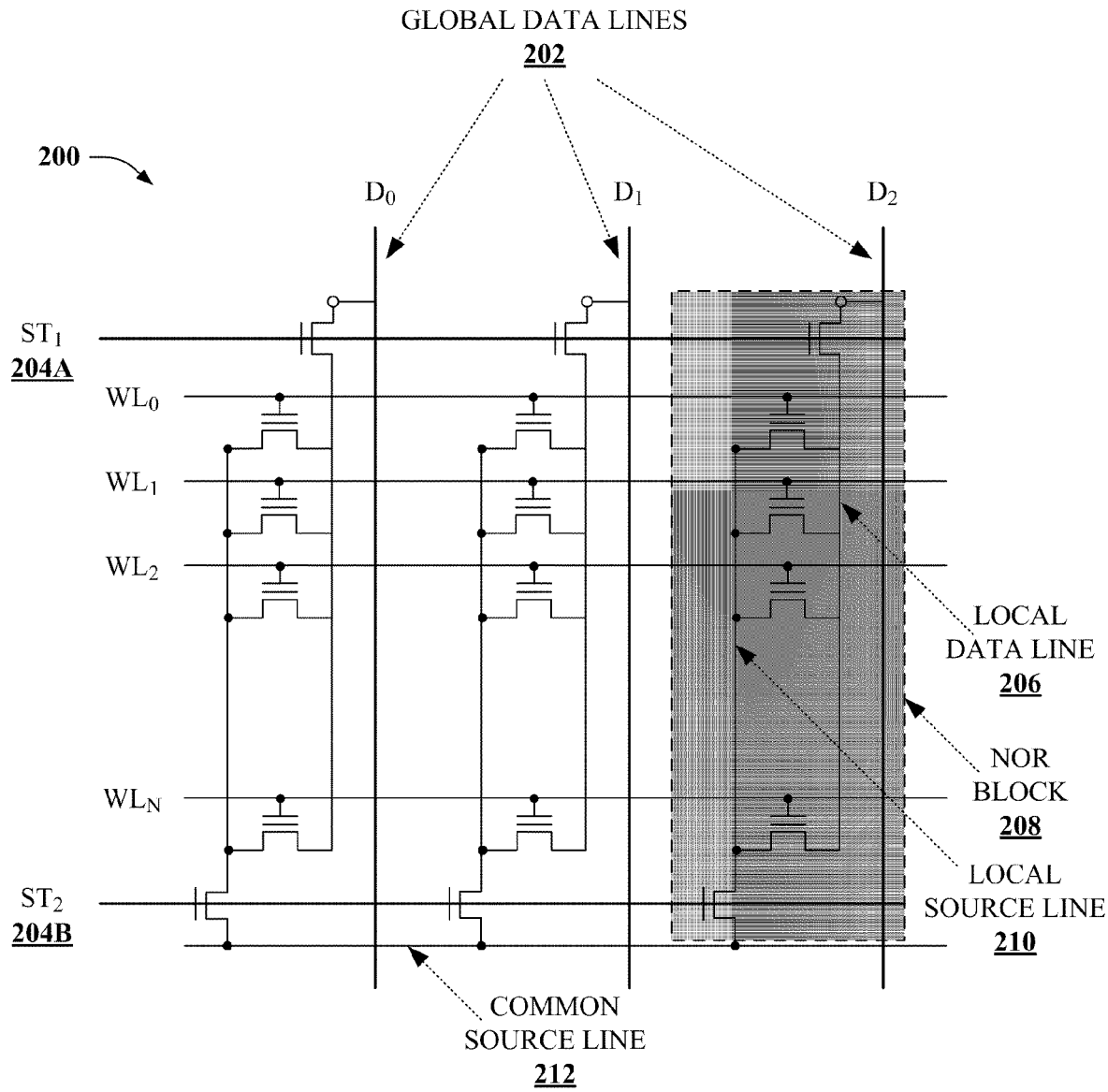
FIG. 2 illustrates a schematic diagram for the example parallel bitline semiconductor architecture.

FIG. 2 illustrates a schematic diagram of one block 200 of parallel bitline semiconductor transistors according to aspects of the subject disclosure. Specifically, the block 200 of transistors extends between two select transistors (STs) 204A and 204B. By selecting STs 204A, 204B (applying a voltage to STs 204A, 204B) the transistor block 200 can be selected from other like transistor blocks (not depicted) in a non-volatile memory module (e.g., a USB Flash memory module—not depicted).

Transistor block 200 comprises a set of global data lines 202, as well as a common source line 212. The global data lines provide voltage to respective local data lines of transistor block 200, enabled by ST 204A. By selecting (applying a particular voltage to) $ST_1$ 204A and global data line $D_2$, for instance, NOR block 208 can be selected at local data line 206. Then, by selecting different wordlines ($WL_0$, $WL_1$, $WL_2$ ... $WL_N$, where N is a positive integer) of transistor block 200, individual transistor cells of NOR block 208 can be read, programmed, erased, and so on.

As one particular example, selecting $ST_1$ 204A and $ST_2$ 204B activates transistor block 200, by coupling common source line 212 to a voltage source or ground. Selecting global data line $D_2$ then activates transistors coupled to the bitline pair (206, 210) of NOR block 208. Additionally, individual transistors of NOR block 208 can be selected by activating respective wordlines of transistor block 200. As is described in more detail infra, channel-based operating processes are employed in programming, erasing and reading selected transistor cells or blocks of cells similar to that provided by FIG. 2, to achieve the advantages in non-volatile memory technology described herein.

Figure 3:
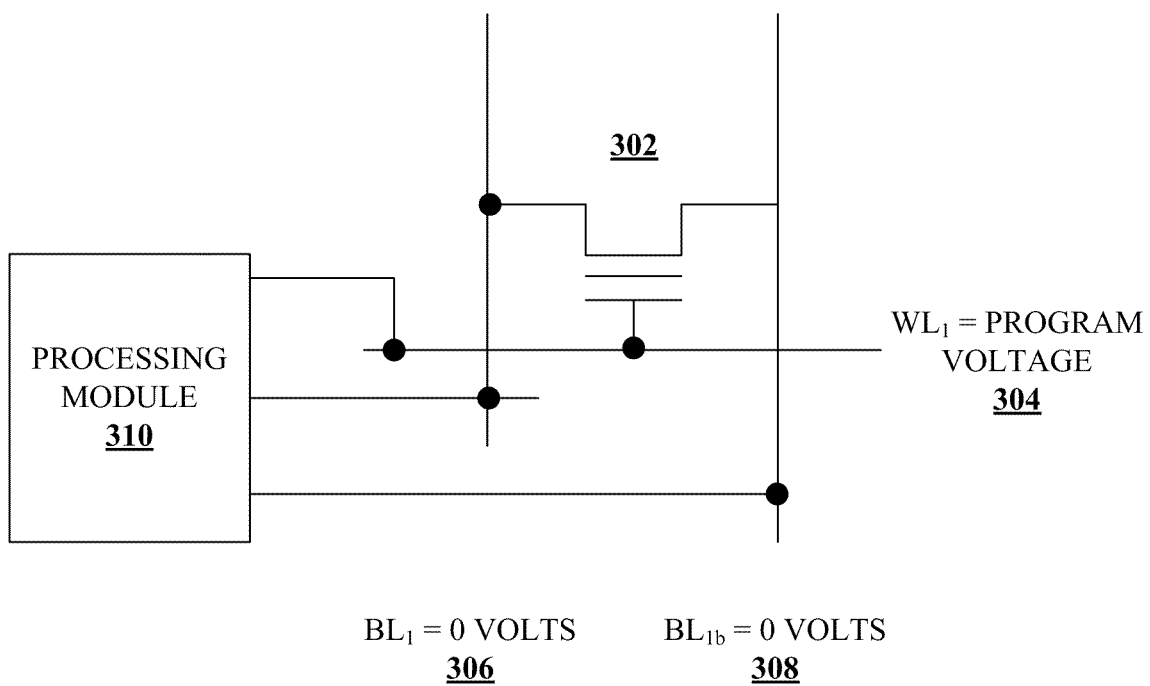
FIG. 3 depicts a diagram of a sample channel programming process for a parallel bitline semiconductor according to aspects of the subject disclosure.

FIG. 3 illustrates a schematic diagram 300 of an example channel-based programming process for a parallel bitline memory cell 302 according to aspects of the subject disclosure. As utilized herein the terms channel-based operating process, channel based programming process, or the like, refer to manipulating inputs to non-volatile semiconductor transistors that result in electron or hole tunneling involving a channel region of those transistors. In at least one exemplary aspect, memory cell 302 comprises a CT-NOR type semiconductor transistor. This CT-NOR type semiconductor transistor can include a single bit memory cell, or a multi-bit memory cell (or multi-level cell, MLC). In either case, CT-NOR cell 302 can comprise a relatively low threshold voltage ($V_T$) level for respective bit-states (program/erase states) of the cell 302. Alternatively, the cell 302 can comprise a CT-NOR cell (302) with relatively high $V_T$s, or a broad range of $V_T$s for multi-bit cell technology.

Diagram 300 also includes a channel-based processing module 310 for programming and erasing the cell 302. Specifically, processing module 310 employs a channel-based operating process for the programming and erasing. For instance, processing module 310 can change wordline and bitline voltages of the cell (including source voltage and drain voltage) to induce a voltage gradient across a channel region of the cell 302. This voltage gradient causes charge to flow to the channel region, programming the cell, or leave the channel region, erasing (or lowering a bit level) of the cell, depending on polarity of the voltage gradient. The operating process employed by processing module 310 is discussed in more detail below, and at FIG. 4, infra (program process), FIG. 5, infra (program and inhibit process), FIG. 6, infra (block erase process), and FIG. 7, infra (wordline erase process). Furthermore, methodologies of FIGS. 8, 9 and 10 can be structurally implemented by process module 310, in at least one aspect of the subject disclosure.

In one illustrative example, CT-NOR cell 302 can comprise relatively low $V_T$s. In this example, an erase state threshold can comprise a negative or zero $V_T$. The cell 302 can be erased by applying a negative voltage between wordline 304 of cell 302 and a Pwell (not depicted) of cell 302. This erase state (or non-program state) can be verified via a voltage threshold of 0 volts. Additionally, CT-NOR cell 302 can comprise a program state $V_T$ above 3.0 volts according to this example. The cell can be programmed at a wordline voltage that exceeds a required program voltage (e.g., 3 volts), and the program state can be verified via a voltage threshold of 3 volts. According to this example, the cell 302 can be read at a median wordline voltage between the negative wordline voltage and the required program voltage, e.g., at 1.5 volts, for instance.

As another example to illustrate additional aspects of the subject disclosure, CT-NOR cell 302 can comprise relatively high $V_T$s. In this example, the cell (302) can also have a wide range between program and erase states. For instance, the program $V_T$ can exceed 20 volts, and the erase $V_T$ can be less than 10 volts. For programming, the wordline voltage can be set to 20 or more volts, and verified via a threshold of 20 volts. For erase, the wordline voltage can be set to 10 or fewer volts, and verified via a threshold of 10 volts. To read CT-NOR cell 302 in this example, the wordline voltage can be set to a suitable mid-level voltage (e.g., 15 volts). It should be appreciated that the foregoing examples are illustrative only and are not intended to limit the scope of the subject disclosure. These examples could be used in practice, but other examples could be used as well. For instance, other suitable program state, erase state and threshold voltages can be utilized in conjunction with CT-NOR cell 302, just as cell 302 can be another type of non-volatile memory technology, such as a floating gate transistor, or some other suitable non-volatile memory transistor. Further, examples considered by one of skill in the art, or made known to one of skill in the art by way of the context provided herein, are incorporated as part of the subject disclosure.

For channel-based processing, a suitable voltage gradient must be established between a gate region of a semiconductor (302) and a channel region of the semiconductor (302). This voltage gradient can be supplied for a parallel bitline semiconductor cell (302) by applying the gradient across a wordline 304 of cell 302, and bitlines $BL_1$ 306 and $BL_2$ 308 of cell 302 (e.g., as described in FIG. 2, supra). As a more specific example, consider a semiconductor transistor (302) comprising a gate coupled to wordline 304, a source coupled to $BL_1$ 306 and drain coupled to $BL_2$ 308. The source and drain can be set to zero volts by grounding bitlines 306 and 308. In addition, the gate can be set to a relatively high program voltage (e.g., 3 volts, 20 volts, etc.) by coupling the wordline to a voltage source (not depicted). The resulting voltage gradient across the gate and source/drain of a CT-NOR cell (302) results in electron tunneling from the channel region of the CT-NOR transistor (302) to a charge trapping region (not depicted) of the cell 302. This process programs the cell (302). This channel-based process is desirable, as it enables very fast program and erase times, and low power consumption. Coupled with a parallel bitline architecture, a fast read time is also achieved, as well as scalable memory cells, and minimal charge disturbance resulting in optimal storage endurance/reliability.

Figure 4:
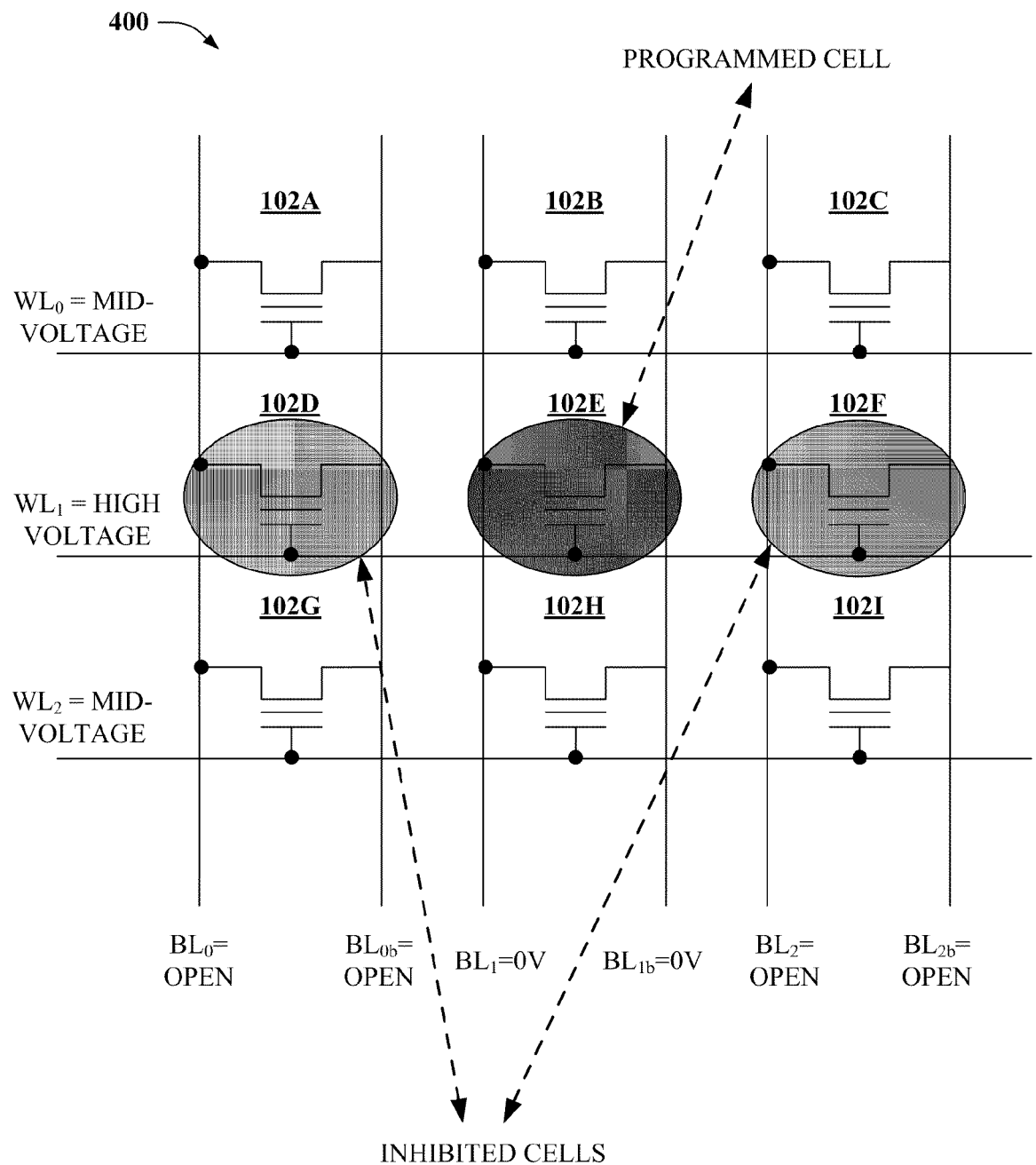
FIG. 4 illustrates a diagram of a sample channel program process including inhibiting for the parallel bitline semiconductor architecture.

FIG. 4 illustrates a schematic diagram of an example channel-based programming process including adjacent inhibiting for a parallel bitline semiconductor array 400 according to aspects of the subject disclosure. Semiconductor array 400 comprises a set of semiconductor transistors 102A-102I arranged in a parallel fashion along respective pairs of bitlines. In addition, each transistor 102A-102I is coupled with a wordline of the semiconductor array 400.

A cell program and inhibit process is applied to the program cell 102E, and at least two other transistors 102D, 102F on $WL_1$. Determining what cells to program and what cells to inhibit can depend on a current program state of wordline cells, or can depend on a program pattern to be applied to the wordline cells, or a combination thereof (E.g., determining whether to program or inhibit can depend on a program/erase pattern for the wordline and current states of wordline cells relative the program/erase pattern). As a particular example, if a pattern of 0, 1, 0 is to be applied to cells 102D, 102E, 102F (where 0 represents an erase state and 1 represents a program state), the pattern can give rise to this pattern for programming cell 102E while inhibiting cells 102D and 102F from such programming, as depicted by FIG. 4 (e.g., see FIG. 9, infra). On the other hand, a current program state of these cells (e.g., 1, 0, 1 of cells 102D, 120E and 102F, respectively), can give rise to this pattern for programming and inhibiting these cells. In at least one aspect, the pattern of programming and inhibiting can result from the 0, 1, 0 pattern to be applied to the cells, in relation to a current program state of the cells (e.g., 0, 0, 0—for instance).

To program cell 102E, wordline $WL_1$ is raised to a high program voltage, as described at FIG. 3, infra. In addition, bitlines $BL_1$ and $BL_{1b}$ coupled to cell 102E are set to zero volts, to induce a voltage gradient across a channel region of cell 102E. This programming process results in electron tunneling to the channel region of cell 102E, programming this set to a voltage at least equal to the high program voltage applied to $WL_1$.

To inhibit other cells (102D, 102F) coupled to wordline $WL_1$, any voltage gradient across the channel region of these cells (102D, 102F) must be small enough so as not to induce electron tunneling across their respective channel regions. To reduce this voltage gradient with respect to cells 102D and 102F, respective bitline pairs $BL_0$-$BL_{0b}$, and $BL_2$-$BL_{2b}$, coupled to these cells 102D, 102F are left open, or unconnected to a voltage source or ground. (As an alternate terminology, bitline pairs $BL_0$-$BL_{0b}$ or $BL_2$-$BL_{2b}$ can be said to be "floating", when unconnected to a voltage source or ground.) Accordingly, the source and drain voltages of these respective cells can increase above zero volts (e.g., as a result of capacitance coupling between the source or drain and a gate of the respective cells 102D, 102F). This can reduce any voltage gradient across the channel region of these cells 102D, 102F, inhibiting programming of the cells 102D, 102F. Optionally, non-selected wordlines $WL_0$ and $WL_2$ of semiconductor array 400 can be set to an intermediate voltage—between ground and the high program voltage—to induce an additional voltage increase on bitlines BL0, BL0b, BL2, and BL2b, further increasing the source/drain voltage of cells 102D and 102F. This additional induced voltage results from the increased capacitance across gate and drain/source regions of other transistors (102A, 102C, 102G, 102I) coupled to wordlines $WL_0$ and $WL_2$. Because the drain/source regions of cells 102A, 102G and 102C, 102I are coupled to common bitline pairs as cells 102D and 102F, respectively, voltage increases observed at the cells on wordlines $WL_0$ and $WL_2$ can affect drain/source voltages at respective cells of wordline $WL_1$. As discussed above, these voltage increases can inhibit programming at cells 102D and 102F, enabling cell-selecting programming with the channel-based programming process of FIG. 3.

Figure 5:
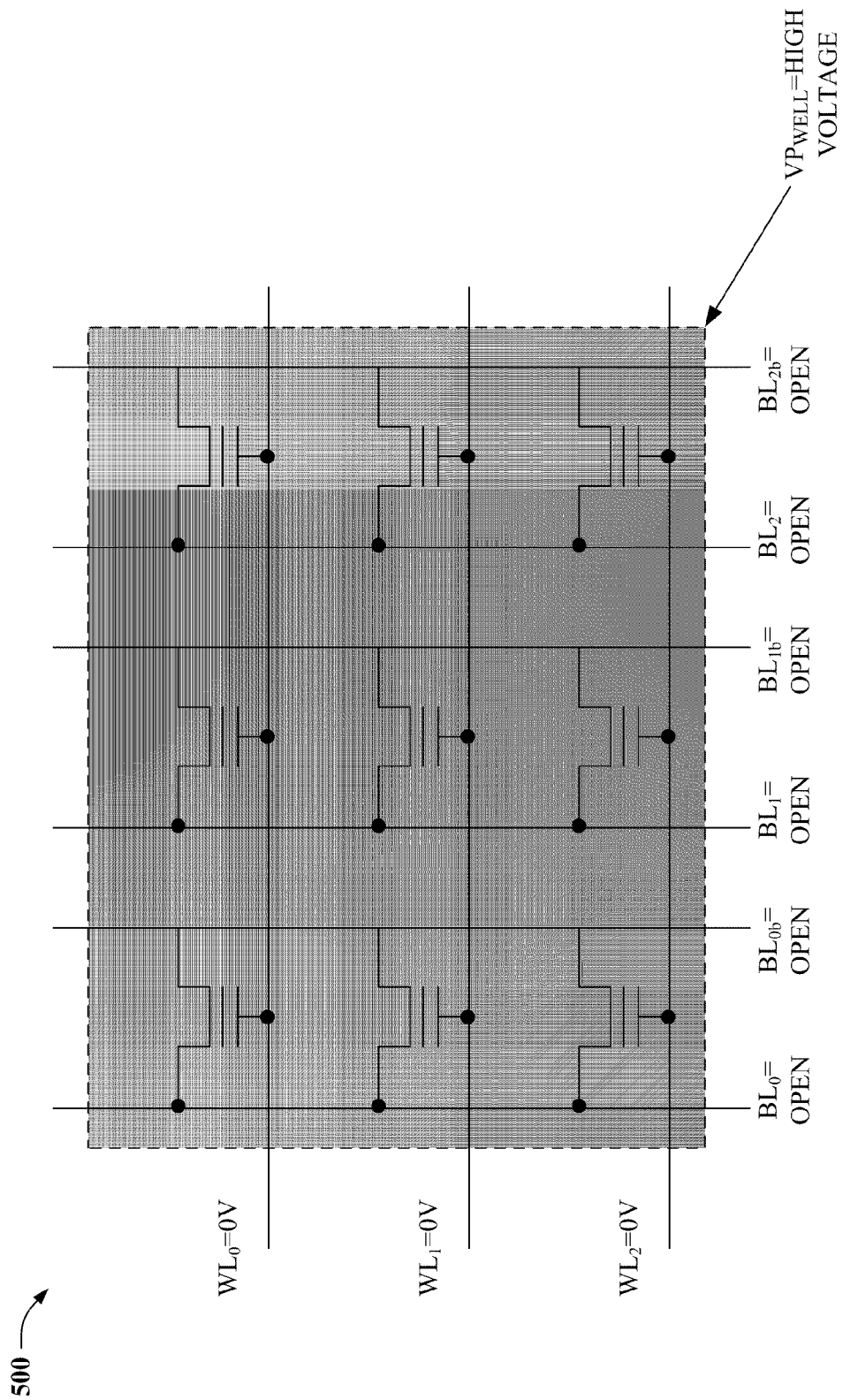
FIG. 5 depicts a diagram of an example block erase process for the parallel bitline semiconductor architecture according to other aspects.

FIG. 5 illustrates a diagram of a block erase process for a parallel bitline semiconductor architecture 500 according to one or more other aspects of the subject disclosure. Semiconductor architecture 500 can be similar to other parallel bitline architectures described herein (e.g., architecture 100, 200, 400, etc.). For instance, architecture 500 can comprise subsets of CT-NOR transistors arranged in parallel with respect to common bitlines ($BL_0$, $BL_{0b}$, $BL_1$, $BL_{1b}$, $BL_2$, $BL_{2b}$). Furthermore, architecture 500 can comprise a set of wordlines $WL_0$, $WL_1$, $WL_2$ for applying respective gate voltages to different subsets of the CT-NOR transistors.

All transistors of semiconductor architecture 500 are considered to be part of a single block—and subject to a single block erase operation. In executing the block erase process, channel-based electron tunneling is induced from the channel region to a gate region of the respective transistors, by setting a well voltage (substrate voltage) of the respective transistors higher than respective gate regions of the respective transistors. If a well-gate region voltage gradient is high enough, electron tunneling is induced out of the channel region of the respective transistors, lowering the stored charge. One way to achieve this result is to set a well voltage VPwell to a relatively high voltage (e.g., 3 volts, 10 volts, 20 volts, etc.) and ground wordlines $WL_0$, $WL_1$, and $WL_2$ to zero volts. In addition, each of the bitline pairs can be disconnected from any voltage source or ground, allowing the drain/source regions to vary in voltage (also referred to as floating the source or drain, or floating a bitline pair). The high well voltage can induce a voltage in the respective drain/source regions, further encouraging electron tunneling out of the channel regions.

In at least one aspect, wordline voltages $WL_0$, $WL_1$, and $WL_2$ can be set to a negative voltage if an erase state $V_T$ for block 500 is negative. Alternatively, the wordline voltages $WL_0$, $WL_1$, $WL_2$ can be set to a higher voltage if the erase state $V_T$ for block 500 is a higher voltage value (e.g., 0 volts, or 1.5 volts, etc.). In either case, the erase state is accomplished if measured $V_T$ of the respective cells is below a predetermined $V_T$ for the erase state.

Figure 6:
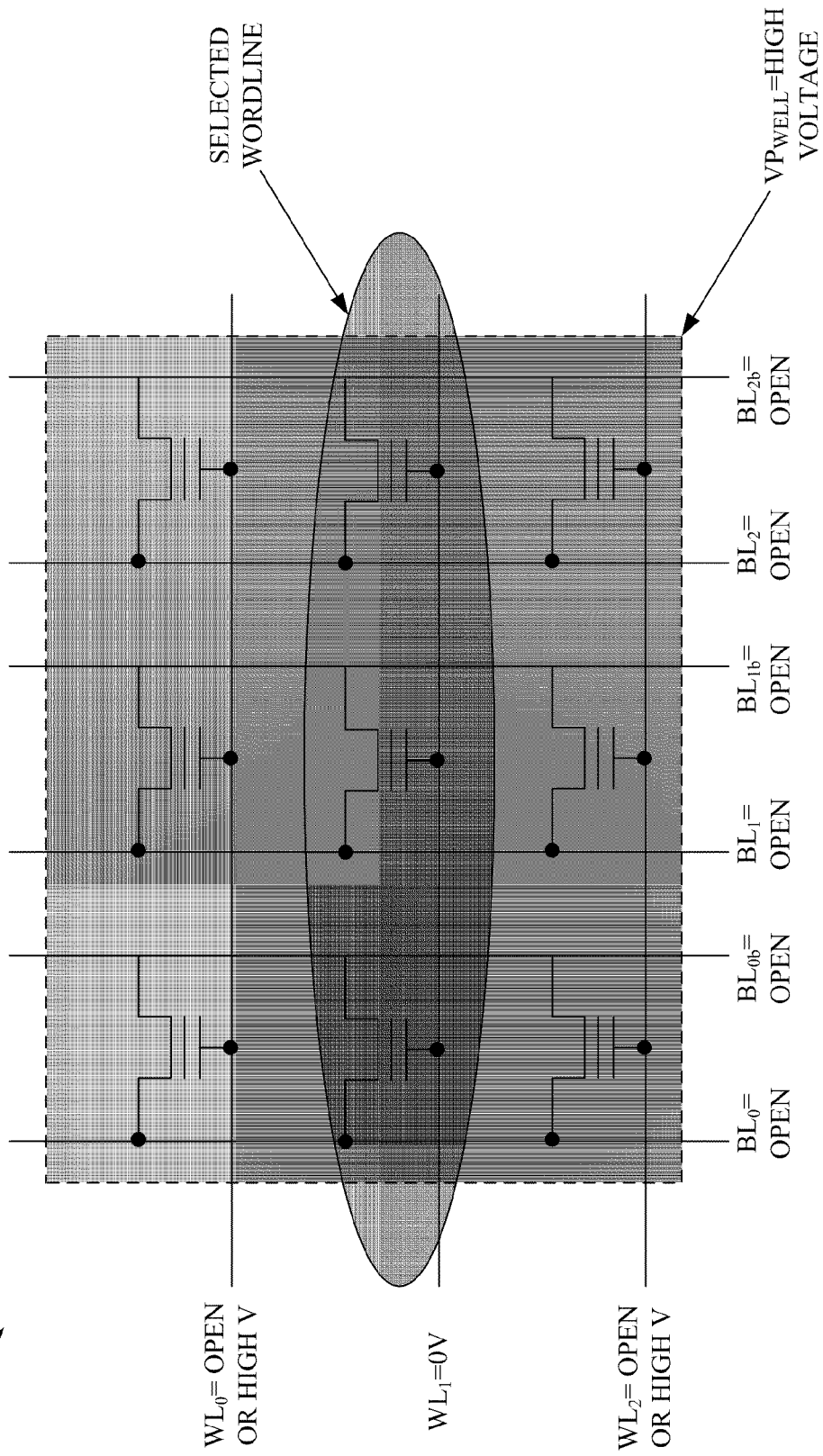
FIG. 6 illustrates a diagram of a sample wordline erase process for the parallel bitline semiconductor architecture according to yet other aspects.

FIG. 6 illustrates a schematic diagram of an example wordline erase operation for a parallel bitline semiconductor architecture 600 according to still other aspects of the subject disclosure. Semiconductor architecture 600 can be similar to other parallel bitline architectures described herein (e.g., architecture 100, 200, 400, 500 etc.). The wordline erase operation depicted by FIG. 6 is intended to erase all transistors coupled with a selected wordline, while inhibiting erasure of non-selected wordlines. Accordingly, FIG. 6 provides a tool for subjective erasure, which can result in increased memory life and sustainability for transistor memory cells over long periods.

As depicted, wordline $WL_1$ is selected to be erased. The erase procedure employed is a channel-based process, according to channel-based operating process described herein. Specifically, to induce channel erasure of $WL_1$ a high Pwell voltage is generated for semiconductor architecture 600. This generates a high voltage at respective well regions of transistors of the architecture 600. Wordline $WL_1$ is grounded (or set to a low voltage source relative the Pwell voltage) to induce a high voltage gradient across the well and gate region, inducing electron tunneling across transistors coupled with $WL_1$, removing stored charge from these cells until their respective $V_T$s approach zero volts (or the low voltage source). Additionally, bitlines $BL_0$, $BL_{0b}$, $BL_1$, $BL_{1b}$, $BL_2$, $BL_{2b}$ are allowed to float, which can aid erasing transistors of $WL_1$, depending on the transistor technology employed for semiconductor architecture 600.

In one aspect, wordlines $WL_0$ and $WL_2$ can be set to a high voltage (which can be about the same as the high Pwell voltage, or a similar voltage) to prevent erasure of transistors coupled to wordlines $WL_0$ and $WL_2$. By setting these wordlines to high voltage, a small voltage gradient exists between gate and well regions of transistors coupled to these wordlines, inhibiting electron tunneling. In an alternative aspect, wordlines $WL_0$ and $WL_2$ can be set to float, and rise as a result of capacitance from the high Pwell voltage, as well as capacitance from the source/drain regions resulting from the floating bitlines. This can help reduce power consumption associated with wordline erase, or erase in general, further improving the semiconductor architecture 600.

Figure 7:
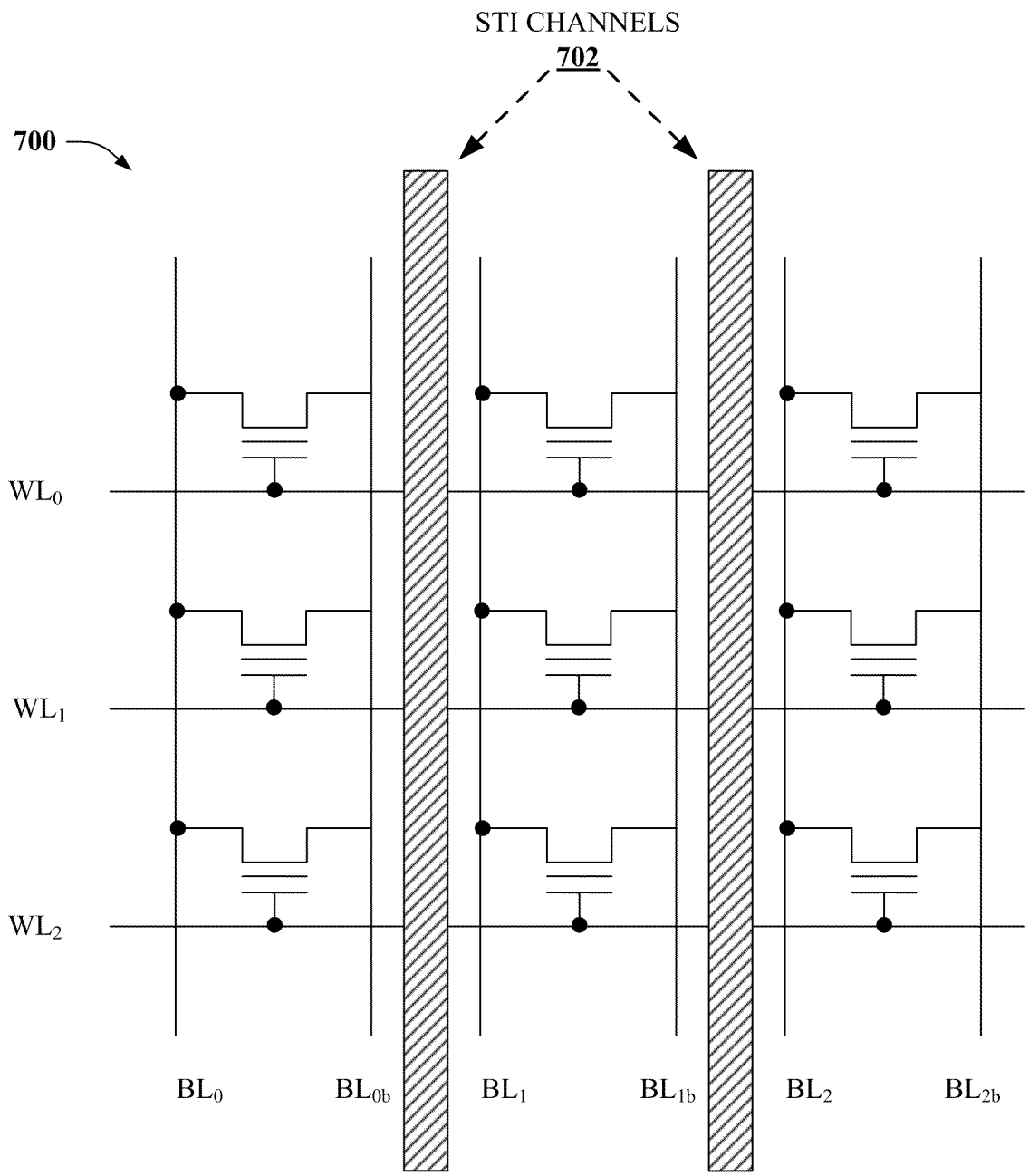
FIG. 7 illustrates a diagram of an example parallel bitline semiconductor architecture comprising shallow trench isolation (STI) between sets of bitlines.

FIG. 7 depicts a schematic diagram of an example semiconductor architecture 700 according to particular aspects of the subject disclosure. Architecture 700 comprises a set of semiconductor transistors arranged in a parallel bitline fashion. This parallel bitline fashion can also be referred to as a buried diffusion bitline, in some arrangements. Buried diffusion bitline refers to a continuous bitline that extends from the source or drain of a first transistor of a parallel block of such transistors, to a source or drain of a last transistor in the parallel block (e.g., see CT-NOR block 208, local source line 212 and local drain line 206 of FIG. 2, supra,). The buried diffusion bitline enables read access to specific cells of a block of cells (700), resulting in very fast read times as compared to non-continuous bitline architectures (e.g., a serial-bitline NAND architecture). In addition, the parallel bitline transistor arrangement provides several other benefits for non-volatile memory devices, including optimal program/erase times, a high degree of density-size scalability, reduced current consumption for program/erase and read processes, and the like. In addition, employing a particular transistor, such as a CT transistor, can also enable multi-bit cells comprising a wide $V_T$ window.

To facilitate reading a target cell, a wordline of the target cell (e.g., $WL_1$) is selected for read by applying a moderate voltage (e.g., between $V_T$s associated with program and erase) to the wordline. For instance, if a program $V_T$=3.5 volts, and erase $V_T$=–0.5 volts, the wordline can be selected for read by applying 1.5 volts to the wordline, or another suitable moderate voltage. In at least some aspects of the subject disclosure, reading the target cell can be facilitated by lowering non-selected wordlines (e.g., $WL_0$ and $WL_2$) to a negative voltage. In these aspects, the negative voltage can mitigate current leakage from cells sharing a pair of bitlines with the target cell (e.g., cells that are also coupled to bitline pair $BL_1/BL_{1b}$). Further, in these aspects, semiconductor architecture 700 is typically coupled with voltage sources (not depicted) that can selectively provide either a positive or a negative voltage to one or more wordlines of architecture 700. In an alternative aspect of the subject disclosure, reading the target cell can be facilitated by raising the bitlines of the target cell (e.g., $BL_1$ or $BL_{1b}$) to a voltage higher than that applied to a substrate of architecture 700. As one illustrative example, wherein the substrate voltage is 0 volts (e.g., coupled to ground), bitline $Bl_1$ can be raised to positive 1.5 volts, and bitline $BL_{1b}$ can be raised to positive 2.0 volts This results in an increase to $V_T$ for the target cell due to the body effect of a metal-oxide semiconductor [MOS] transistor). Utilizing the above example, an erase threshold of –0.5 volts might be increased to +0.5 volts, while a program VT could be raised from 3.5 volts to 4.50 volts, for instance. This increase in $V_T$, cell leakage can be mitigated for bitline $BL_1/BL_{1b}$ cells without applying a negative wordline voltage to the non-selected wordlines, discussed above. This alternative aspect can be useful to simplify voltage sources associated with semiconductor architecture 700 (e.g., enabling less complicated wordline decoding circuitry), while still enabling a low or zero voltage erase state $V_T$.

In addition to the foregoing benefits, semiconductor architecture 700 further comprises shallow trench isolation (STI) layers 702 between respective bitline pairs (source and drain layers) of the architecture (700). In at least one example, the STI layers can comprise a groove or trench formed in a semiconductor substrate, filled with an electrically insulating layer. The electrically insulating layer can comprise an oxide layer in some aspects of the subject disclosure. According to particular aspects, the oxide layer can comprise a silicon dioxide layer, or other suitable electrically resistive oxide layer.

The STI layers 702 are provided to inhibit charge leakage between bitline pairs of semiconductor architecture 700. This inhibited charge leakages enables a cell on one bitline to be programmed while a cell on an adjacent bitline is inhibited from programming. The inhibited charge leakage also improves a sensing margin, since bitlines separated by an STI layer (702) are electrically decoupled from one another. In conjunction with a channel-based operating process, STI layers 702 can reduce capacitance across bitlines, maximizing cross-channel gradients, enabling electron tunneling at lower voltages and voltage gradients. Accordingly, improved power consumption can also be achieved with semiconductor architecture 700 in conjunction channel-based process technologies described herein.

The aforementioned schematic diagrams have been described with respect to interaction between several components, or memory architectures. It should be appreciated that such diagrams and architectures can include those architectures specified therein, some of the specified architectures, and/or additional architectures. For example, a schematic diagram could include STI layers 702, and semiconductor architecture 200, or a different combination of these or other architectures. Sub-components could also be implemented as architectures electrically coupled to other sub-components rather than included within a parent architecture. Additionally, it should be noted that one or more disclosed processes could be combined into a single process providing aggregate functionality. For instance, a program process can comprise an erase process, or vice versa, to facilitate programming and erasing a semiconductor cell by way of a single process. Components of the disclosed architectures can also interact with one or more other components not specifically described herein but known by those of skill in the art.

Figure 8:
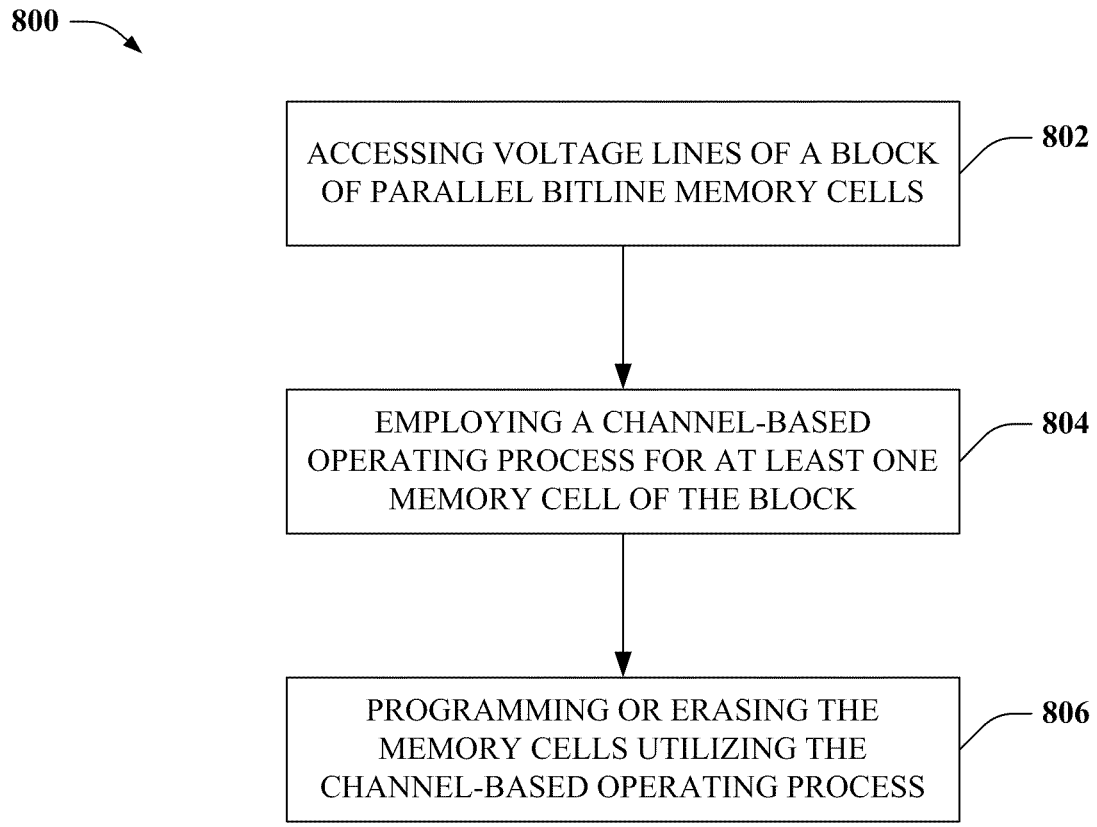
FIG. 8 illustrates a flowchart of an example methodology providing channel-based processing for a parallel bitline semiconductor architecture.
Figure 9:
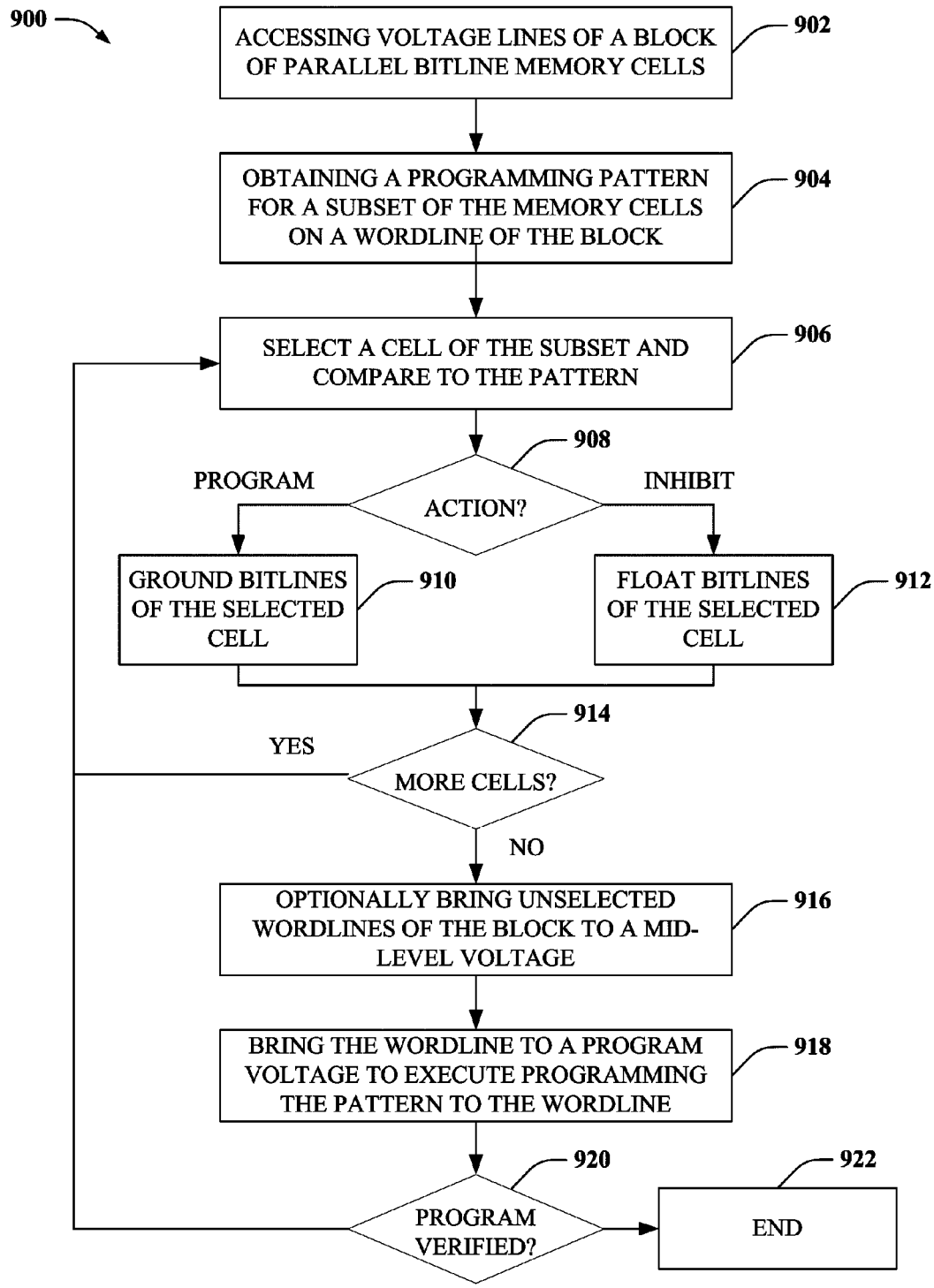
FIG. 9 depicts a flowchart of a sample methodology providing channel-based programming and erasing for the parallel bitline semiconductor architecture.
Figure 10:
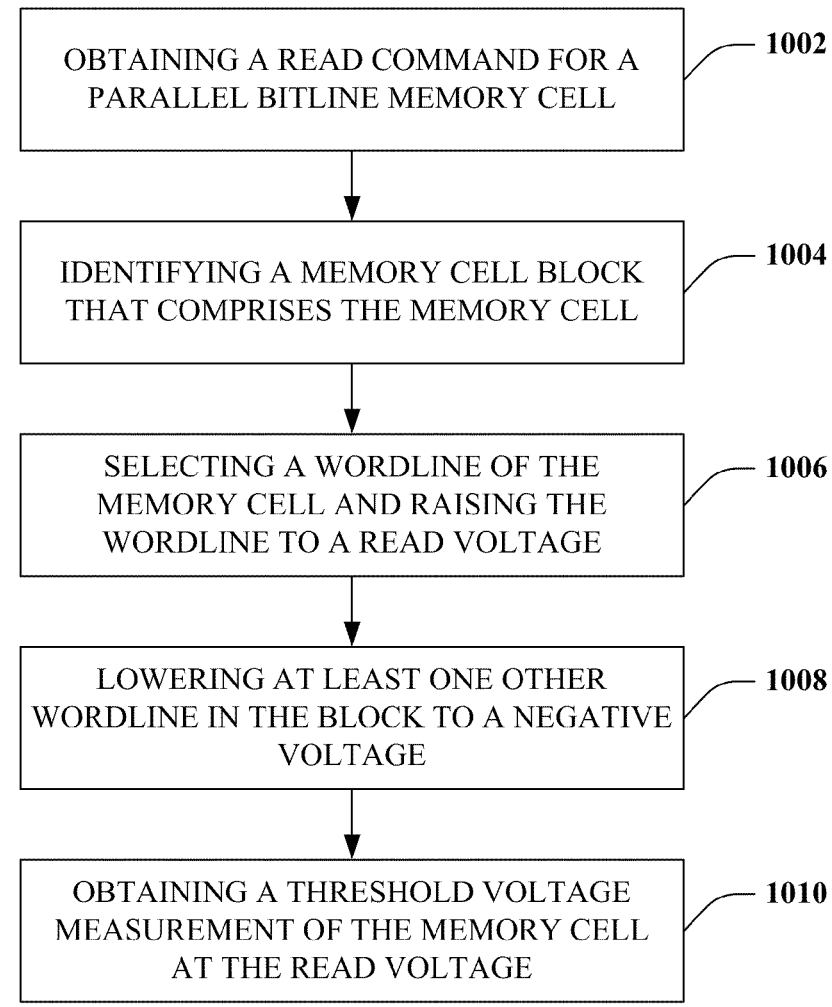
FIG. 10 illustrates a flowchart of a sample methodology providing improved read processing for the parallel bitline semiconductor architecture.

In view of the exemplary diagrams described supra, process methodologies that may be implemented in accordance with the disclosed subject matter will be better appreciated with reference to the flow charts of FIGS. 8-10. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter. Additionally, it should be further appreciated that the methodologies disclosed hereinafter and throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 8 depicts a flowchart of an example process methodology 800 for programming a parallel bitline semiconductor architecture according to aspects of the subject disclosure. Specifically, method 800 involves a channel-based operating process. Specifically, method 800 invokes a voltage gradient across a channel region of one or more transistors of the semiconductor architecture to program or erase transistors, according to the process methodology.

At 802, method 800 can access voltage lines of a block of parallel bitline memory cells. Accessing the voltage lines can comprise applying a predetermined voltage associated with activating or selecting the block of memory cells, and can also refer to selecting the block of parallel bitline memory cells. At 804, method 800 can comprise employing a channel-based operating process for at least one memory cell of the block. The channel-based operating process can comprise generating a voltage gradient across a channel region of the at least one memory cell. In some aspects, the voltage gradient can be a positive gradient, in that a gate region of the at least one memory cell is held to higher voltage than a well region of the at least one memory cell. In other aspects, the voltage gradient can be a negative gradient, in that the gate region of the at least one memory cell is held to a lower voltage than the well region of the at least one memory cell.

At 806, method 800 can comprise programming or erasing at least one memory cell utilizing the operating process. Particularly, programming the cell(s) can comprise employing a positive voltage gradient across a channel region of the cell(s). In addition, the positive voltage gradient can comprise a gate voltage associated with a desired program state of the cell(s). In addition, erasing the cell(s) can comprise employing a negative voltage gradient across the channel region of the cell(s). Further, the negative voltage gradient can comprise a gate voltage associated with a desired erase state of the cell(s). In at least one aspect, the $V_T$ of the voltage erase state can be a negative voltage.

FIG. 9 illustrates a flowchart of an example process methodology 900 according to still other aspects of the subject disclosure. Particularly, process methodology 900 can provide a channel-based programming and inhibiting process for a parallel bitline semiconductor architecture. In at least one aspect of the subject disclosure, the semiconductor architecture comprises CT-NOR semiconductor transistors according to the parallel bitline semiconductor architecture.

At 902, method 900 can comprise access voltage lines of a block of parallel bitline memory cells. At 904, method 900 can comprise obtaining a programming pattern for a subset of the memory cells on a common wordline of the block of memory cells. The program pattern can comprise a digital representation of a desired program state for the subset of the memory cells on the common wordline. In some aspects, the digital representation comprises a single-bit (e.g., 0, 1) pattern; in other aspects, the digital representation comprises a multi-bit (e.g., 0, 1, 2, 3) pattern.

At 906, method 900 can comprise selecting a cell of the subset and comparing the cell to the pattern. At 908, a determination is made as to whether the selected cell requires programming or inhibiting. The determination can be based at least in part on whether the selected cell is to be programmed or erased according to the pattern. Optionally, the determination can also be made based on a current state of the selected cell, and whether the current state matches the pattern. If the selected cell is to be programmed, method 900 proceeds to 910; otherwise method 900 proceeds to 912 to inhibit the selected cell.

At 910, method 900 connects bitlines of the selected cell to ground. Grounding the bitlines can be implemented to induce a voltage gradient across a channel region of the selected cell, to induce cross-channel electron (or hole) tunneling, for instance. From 910, method 900 proceeds to 914. At 912, method 900 floats (or disconnects from voltage or ground) the bitlines of the selected cell. Floating the bitlines can be implemented to reduce a voltage gradient across the channel region of the selected cell, to inhibit cross-channel electron (or hole) tunneling, for instance. From 912, method 900 proceeds to 914.

At 914, a determination is made as to whether any additional cells of the subset require programming or inhibiting according to the pattern. If additional cells require programming, method 900 returns to 906 to iteratively select those cells and apply an appropriate voltage to their respective bitlines. If no additional cells require programming (or inhibiting), method 900 proceeds to 916. At 916, method 900 optionally brings non-selected wordlines of the block of memory cells to a mid-level voltage. In at least one aspect of the subject disclosure, this mid-level voltage can be any suitable voltage between a program voltage utilized to program a cell, and a ground voltage applied to the bitlines of the programmed cell(s) at reference number 910. In other aspects, other suitable mid-level voltages can be employed for the non-selected wordlines, to further reduce the voltage gradient across the channel region of cells that are to be inhibited from programming. At 918, method 900 can bring the common wordline to a program voltage level to program the pattern to the common wordline.

At 920, method 900 can verify programming of the subset of cells. Verification can involve measuring (e.g., employing a sensing transistor coupled to a bitline of a measured cell) a voltage of cells on the selected wordline, and comparing these measured voltages to the program pattern. If the program is verified at 920, method 900 proceeds to 922 and terminates. Otherwise, method 900 returns to 906 to identify cells for programming or inhibiting (reference numbers 908-914) and re-program the wordline (reference numbers 916-918).

FIG. 10 depicts a flowchart of a sample process methodology 1000 according to at least one other aspect of the subject disclosure. Specifically, process methodology 1000 relates to a read process applicable to a parallel bitline semiconductor architecture. As one example, the parallel bitline semiconductor architecture can be similar to other architectures described herein, and can at least include CT-NOR semiconductor transistors.

At 1002, method 1000 can comprise obtaining a read command for one or more memory cells of the parallel bitline semiconductor architecture. At 1004, method 1000 can comprise identifying a memory cell block that comprises the memory cell(s), and selecting the identified block. At 1006, method 1000 can comprise selecting a wordline coupled to the memory cell(s) and raising the selected wordline to a read voltage. Raising the selected wordline to the read voltage can comprise coupling the wordline with a predetermined voltage source associated with the read voltage, for instance. Additionally, at 1008, method 1000 can comprise lowering at least one non-selected wordline of the memory block to a negative voltage. At 1010, method 1000 can comprise obtaining a threshold voltage measurement of the memory cell(s) while the selected wordline is raised to the read voltage. The threshold voltage measurement can be reported out in response to the read command obtained at reference number 1002.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" "has" or "having" are used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Figure 11:
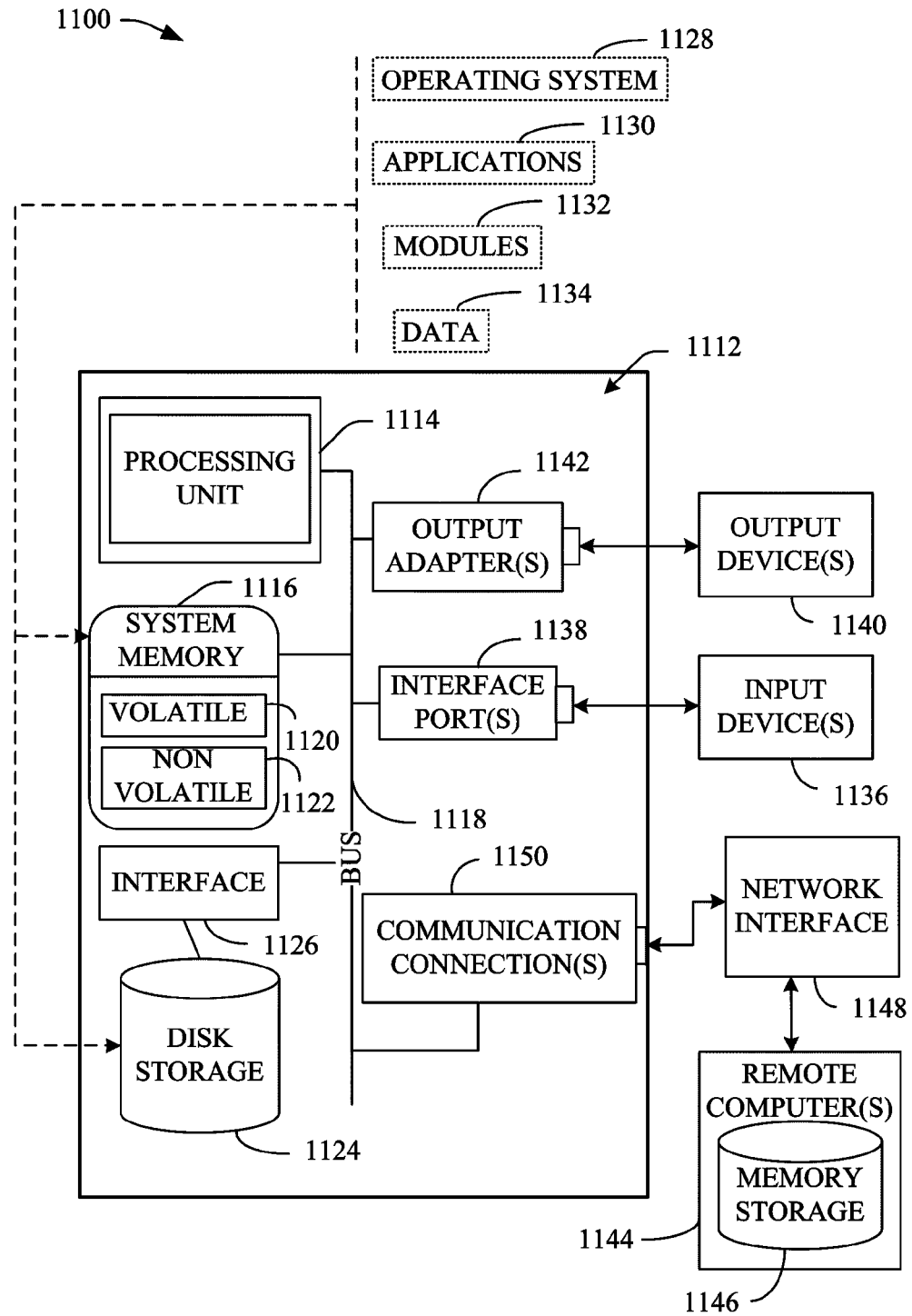
FIG. 11 depicts a block diagram of an example processing system for utilizing or accessing non-volatile memory according to general aspects disclosed herein.

In order to provide a context for the various aspects of the disclosed subject matter, FIG. 11, as well as the following discussion, is intended to provide a brief, general description of a suitable environment in which various aspects of the disclosed subject matter can be implemented or processed. While the subject matter has been described above in the general context of semiconductor architectures and process methodologies for manipulating semiconductor devices of such architectures, those skilled in the art will recognize that the subject innovation also may be implemented in combination with other architectures or process methodologies. Moreover, those skilled in the art will appreciate that the inventive processes may be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a Flash memory module. In a distributed computing environment, program modules may be located in both local and remote memory storage modules or devices.

With reference to FIG. 11, a suitable environment 1100 for implementing various aspects of the claimed subject matter can include a host computer 1112. The host computer 1112 includes a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114.

The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1116 includes volatile memory 1120 and nonvolatile memory 1122. The basic input/output system (BIOS), containing the basic routines to transfer information between elements within the computer 1112, such as during start-up, is stored in nonvolatile memory 1122. By way of illustration, and not limitation, nonvolatile memory 1122 can include ROM, PROM, EPROM, EEPROM, or Flash memory (e.g., AND Flash, NAND Flash, NOR Flash, CT-NOR Flash, CT-NAND Flash, and so on). Furthermore, nonvolatile memory 1122 can provide the platform for the various semiconductor architectures described herein. Volatile memory 1120 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Host computer 1112 also includes removable/non-removable, volatile/non-volatile computer storage media. FIG. 11 illustrates, for example, a disk storage 1124. Disk storage 1124 includes, but is not limited to, devices like a magnetic disk drive, floppy disk drive, tape drive, Jaz drive, Zip drive, LS-100 drive, flash memory card, or memory stick. In addition, disk storage 1124 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1124 to the system bus 1118, a removable or non-removable interface is typically used, such as interface 1126.

It is to be appreciated that FIG. 11 describes software that acts as an intermediary between users and the basic computer resources described in the suitable operating environment 1100. Such software includes an operating system 1128. Operating system 1128, which can be stored on disk storage 1124, acts to control and allocate resources of the host computer system 1112. System applications 1130 take advantage of the management of resources by operating system 1128 through program modules 1132 and program data 1134 stored either in system memory 1116 or on disk storage 1124. It is to be appreciated that the disclosed subject matter can be implemented with various operating systems or combinations of operating systems.

A user enters commands or information into the host computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port may be used to provide input to host computer 1112 and to output information from host computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Host computer 1112 can operate in a networked environment using logical connections to one or more remote computers, such as remote computer(s) 1144. The remote computer(s) 1144 can be a personal computer, a server, a router, a network PC, a workstation, a microprocessor based appliance, a peer device or other common network node and the like, and typically includes many or all of the elements described relative to host computer 1112. For purposes of brevity, only a memory storage device 1146 is illustrated with remote computer(s) 1144. Remote computer(s) 1144 is logically connected to host computer 1112 through a network interface 1148 and then physically connected via communication connection 1150. Network interface 1148 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1150 refers to the hardware/software employed to connect the network interface 1148 to the bus 1118. While communication connection 1150 is shown for illustrative clarity inside host computer 1112, it can also be external to host computer 1112. The hardware/software necessary for connection to the network interface 1148 includes, for exemplary purposes only, internal and external technologies such as, modems including regular telephone grade modems, cable modems and DSL modems, ISDN adapters, and Ethernet cards.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes. In addition, while a particular feature may have been disclosed with respect to only one of several implementations, such feature may be combined with one or more other features of the other implementations as may be desired and advantageous for any given or particular application.

What is claimed is:

1. A non-volatile memory device, comprising:
    a parallel bitline semiconductor architecture comprising a plurality of wordlines, and a plurality of transistors, each of the plurality of transistors having a gate that is electrically connected to respective ones of the plurality of wordlines a source node that is electrically connected directly to a local source line and a drain node that is electrically connected directly to a local bitline, wherein the local source line is connected to a common source line via a select transistor and the local bitline is connected to a common bit line by a second select transistor; and
    a channel-based processing component configured to ground the local source line and the local bitline to program one transistor of the plurality of transistors, wherein the channel-based processing component inhibits programming of a non-program transistor sharing a common wordline with the one transistor by floating a second local source line and a second local bitline connected to the non-program transistor.

2. The non-volatile memory cell of claim 1, the channel-based processing component induces electron tunneling to or from a channel region of the one transistor to program or erase, respectively, the one transistor.

3. The non-volatile memory cell of claim 1, the channel-based processing component is further configured to apply zero volts to a selected wordline of the parallel bitline semiconductor architecture and to float respective local source lines and local bitlines connected to transistors on the selected wordline to erase the transistors on the selected wordline.

4. The non-volatile memory cell of claim 1, the channel-based processing component raises at least one of the plurality of wordlines other than the common wordline to a moderate program voltage to inhibit the programming.

5. The non-volatile memory cell of claim 4, the moderate program voltage has a voltage value less than a program voltage applied to the common wordline and greater than ground voltage.

6. The non-volatile memory cell of claim 1, the channel-based processing module:
    obtains a selected transistor for read measurement;
    sets a wordline voltage of the selected transistor to a read voltage; and
    measures a charge level or threshold voltage ($V_T$) of the selected transistor to implement the read measurement.

7. The non-volatile memory cell of claim 6, the channel-based processing module sets a wordline of the plurality of wordlines that is not connected with a gate of the selected transistor to a voltage of opposite polarity from the read voltage to facilitate the read measurement.

8. The non-volatile memory cell of claim 1, the plurality of transistors comprise charge trap (CT) transistors.

9. The non-volatile memory cell of claim 8, the CT transistors comprise CT-NOR transistors.

10. The non-volatile memory cell of claim 1, wherein at least one of:
    the plurality of transistors comprise at least one program state, or an erase state, having a negative gate voltage; or
    the plurality of transistors comprise multi-layer cell (MLC) transistors.

11. The non-volatile memory device of claim 1 configured for use with a computer, a laptop, a personal digital assistant (PDA), a cellular telephone, a smartphone, or an electronic gaming device, or a combination thereof.

12. A method of processing a parallel bitline semiconductor architecture, comprising:
    selecting a block of memory cells of the semiconductor architecture;
    applying zero volts to respective ones of a pair of local bitlines directly connected to a source and drain, respectively, of a plurality of charge trap NOR transistors of the block of memory cells; and applying a program voltage to a wordline connected to a gate of a selected one of the plurality of charge trap NOR transistors, and applying a moderate voltage smaller than the program voltage and greater than zero volts to a second wordline connected to non-selected one of the plurality of charge trap NOR transistors, to facilitate programming the selected one and inhibiting programming of the non-selected one of the plurality of charge trap NOR transistors.

13. The method of claim 12, applying the program voltage further comprises increasing the wordline to ten or more volts above ground.

14. The method of claim 12, further comprising floating a second pair of local bitlines connected to a source and drain, respectively, of the non-selected one of the plurality of charge trap NOR transistors to further facilitate the inhibiting programming.

15. The method of claim 12, further comprising raising a well voltage of the block of memory cells to a high voltage.

16. The method of claim 15, further comprising at least one of:
grounding all wordlines of the block of memory cells to erase all memory cells of the block of memory cells; or
grounding the wordline and raising the voltage of the second wordline to a moderate voltage to erase only cells connected to the wordline.

17. A system for processing a non-volatile memory cell, comprising:
means for selecting a block of memory cells comprising a target cell in a parallel bitline semiconductor architecture, the target cell being one of a plurality of cells having respective source nodes and respective drain nodes, the source nodes being connected directly to one of a pair of local bitlines and the drain nodes being connected directly to a second of the pair of local bitlines, the one of the pair of local bitlines is connected to a common source line by a first select transistor and the second of the pair of local bitlines is connected to a common data line by a second select transistor;
means for raising at least one of the pair of local bitlines to a higher voltage than applied to a substrate of the target cell;
means for raising a wordline of the target cell to a read voltage; and
means for mitigating current leakage in a second cell of the plurality of cells connected directly to the pair of local bitlines.

18. The system of claim 17, further comprising at least one of:
means for lowering a second wordline connected to a gate of the second cell to a negative voltage to facilitate the mitigating current leakage; or
means for increasing a $V_T$ of the second cell to facilitate the mitigating current leakage.

* * * * *